United States Patent [19]
Bailey et al.

[11] Patent Number: 5,855,803
[45] Date of Patent: Jan. 5, 1999

[54] TEMPLATE TYPE CAVITY-FORMATION DEVICE FOR LOW TEMPERATURE COFIRED CERAMIC (LTCC) SHEETS

[75] Inventors: Alex Bailey, Hampstead; Ronnie Starling, Columbia; John Chino, Arnold; Tapan Gupta, Ellicott City, all of Md.

[73] Assignee: Northrop Grumman Corporation, Los Angeles, Calif.

[21] Appl. No.: 752,111

[22] Filed: Nov. 20, 1996

[51] Int. Cl.⁶ .............................. C23F 1/00; B32B 31/00
[52] U.S. Cl. ........................... 216/56; 156/252; 156/256
[58] Field of Search ............................... 216/17, 52, 56; 156/252, 256, 323, 513, 517

[56] References Cited

U.S. PATENT DOCUMENTS

| | | | |
|---|---|---|---|
| 4,737,208 | 4/1988 | Bloechle et al. | 156/90 |
| 5,435,875 | 7/1995 | Saitoh et al. | 156/245 |
| 5,538,582 | 7/1996 | Natarajan et al. | 156/285 |
| 5,573,622 | 11/1996 | Hass et al. | 156/289 |
| 5,683,535 | 11/1997 | Karr | 156/285 |

*Primary Examiner*—R Bruce Breneman
*Assistant Examiner*—Anita Alanko
*Attorney, Agent, or Firm*—Walter G. Sutcliff

[57] ABSTRACT

A cavity pattern for a laminated structure such as a substrate for integrated circuitry is formed in a sheet of unfired low temperature cofired ceramic (LTCC) material also known as "green" tape. One sheet at a time is placed in a flexible ram forming die including a resilient rubber pressure pad and a template including the pattern to be formed in the sheet. A pair of outer pressure plates hold the pressure pad and template in place. When a sheet of unfired LTCC material is placed between the pressure pad and template and pressurization is applied to the outer plates, extrusion of the rubber material through the template causes the tape to be sheared off at the edges of the holes in the template, thus effectively cutting the required pattern in the sheet. Following pressurization, the sheet now with the pattern cut therein is removed from the die and the residual tape cut-outs are subsequently removed from the template by a vacuum.

8 Claims, 2 Drawing Sheets

TEMPLATE TYPE CAVITY-FORMATION DEVICE FOR LOW TEMPERATURE COFIRED CERAMIC (LTCC) SHEETS

CROSS REFERENCE TO RELATED APPLICATIONS

This application is related to application Ser. No. 08/686,000, (WE58,831) now U.S. Pat. No. 5,683,535 entitled, "An Improved Method Of Producing Cavities In LTCC Substrates", filed in the name of Scott P. Karr on Jul. 25, 1996, and U.S. Ser. No. 08/685,881, (WE58,830) entitled, "A Technique For Integrating Buried Resistors In LTCC Substrates Using Vias", filed in the names of Scott P. Karr and Patricia A. Karr on Jul. 25, 1996. These applications are assigned to the assignee of the present invention and are intended to be incorporated herein by reference.

BACKGROUND OF THE INVENTION

1. Field of the Invention

This invention relates generally to a method and apparatus for cutting thin sheet laminates, and more particularly to a precision die for cutting a cavity pattern in unfired or "green" low temperature cofired ceramic (LTCC) sheets.

2. Description of Related Art

Cavities are known to be formed in laminated multilayer low temperature cofired ceramic (LTCC) structures such as substrates for electronic circuitry, and more particularly integrated circuits to isolate signals and to use the ceramic itself as component housing. Such a structure is shown, for example, in the aforementioned related application, U.S. Ser. No. 08/686,000 (WE58,831).

In order to form these components which often involve complex shapes, the individual sheets of unfired or "green" tape of LTCC material have a cavity pattern cut into them prior to lamination. Individual sheets may typically have anywhere between 10 and 200 cavities of various shapes and sizes formed therein. One part design, for example, may require between 2 and 8 different cavity patterns.

Conventional practice for forming cavities in unfired LTCC laminates currently involves one of four well known methods, namely: mechanical routing, hard-die tooling, laser cutting and punch nibbling. All of these methods require moderate to high capital investment; however, the trade off in these methods is in the volume vs. labor hours required.

With respect to mechanical routing, a capital investment of $70K–$80K would typically be involved and while relatively precise (0.002 in.) cutting can be obtained, a set-up time and run time of 5–10 minutes per layer is normally required, depending upon the complexity of the design. Furthermore, cavity complexity adds considerably to the run time, even though a wide variety of complex designs can be accommodated.

With respect to hard die tooling, a typical capital investment of $40K–$75K dollars per cavity layer design is required. A precision of 0.001–0.002 inches is typical, and a set up and run time of 0.5–1 minute per layer is needed regardless of cavity complexity and can accommodate any design complexity. However, a large-volume fixed design product normally associated with this type of fabrication.

With respect to laser cutting, a relatively high capital investment of $80K–$200K dollars is typically required, and although a relatively precise (<0.002 in.) product can be fabricated, set up and run time of 5–20 minutes per layer is required. Increased complexity adds considerably to run time, even though any complex design can be accommodated. Also, considerable engineering support is normally required for maintaining such apparatus.

As to punch nibbling, a relatively high capital investment $100K–$150K dollars is normally required; however, relatively high precision (<0.001 in.) can be obtained. Since this type of equipment is automated, run times are varied and difficulties with complex designs are encountered due to fixed punch sizes. Such apparatus is also accompanied by considerable engineering support. Also, conductor printing difficulties are encountered, since cavities are formed prior to conductor printing.

SUMMARY

Accordingly, it is the primary object of the present invention to simplify cavity formation in the fabrication of low temperature cofired ceramic (LTCC) laminated structures.

It is another object of the present invention to provide a reduction of the process time and consequently the labor hours involved in the formation of cavities in LTCC structures such as substrates for electronic components and printed circuit conductors.

It is a further object of the invention to provide a simple and yet economically feasible way to fabricate cut-outs in unfired or "green" sheets of LTCC material for the formation of a laminated structure having multiple cavities of various shapes and sizes.

The foregoing and other objects are realized by the formation of a predetermined pattern of cut-outs in a sheet of unfired low temperature cofired ceramic (LTCC) material also known as "green" tape. One sheet at a time is placed in a flexible ram forming die including a rubber pressure pad $\frac{1}{16}"-\frac{1}{8}"$ thick and a template including the pattern to be formed in the sheet. A pair of outer pressure plates hold the pressure pad and template in place. When a sheet of unfired LTCC material is placed between the pressure pad and template and pressurization is applied to the outer plates, extrusion of the rubber material through the template causes the tape to be sheared off at the edges of the holes in the template, thus effectively cutting the required pattern in the sheet. Following pressurization, the sheet now with the pattern cut therein is removed from the die and the residual tape cut-outs are subsequently removed from the template by a vacuum.

Further scope of applicability of the present invention will become apparent from the detailed description provided hereinafter. However, it should be understood that the detailed description and the specific examples indicating the preferred embodiments thereof are provided by way of illustration only, since various changes and modifications coming within the spirit and scope of the invention will become apparent to those skilled in the art.

BRIEF DESCRIPTION OF THE DRAWINGS

The present invention will become more fully understood from the detailed description provided hereinbelow in the accompanying drawings which are given by way of illustration only, and thus are not limitative of the invention, and wherein.

DETAILED DESCRIPTION OF THE INVENTION

This invention is directed to a template cavity-formation device comprising a forming die and a uniaxial press therefor, including a flexible ram for fabricating a cut-out cavity pattern in a sheet of unfired low temperature cofired ceramic (LTCC) material, also referred to in the art as "green" tape. One or more cavities of a predetermined shape and size can be produced when a laminated stack of the LTCC sheets is subsequently formed in the production of a substrate for integrated circuit wiring and components.

Figure 1:
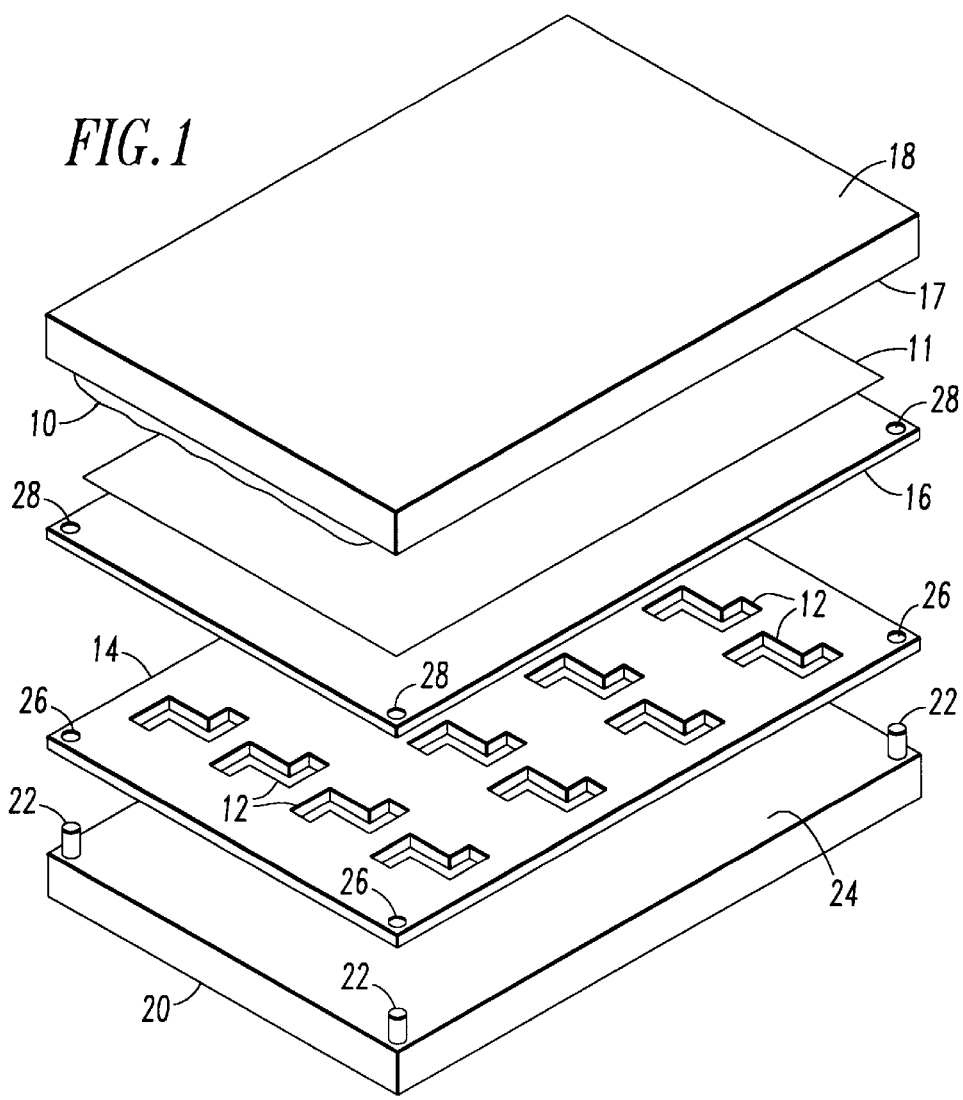
FIG. 1 is an exploded perspective view illustrating the preferred embodiment of apparatus for fabricating a cavity pattern in a sheet of low temperature cofired ceramic sheet material.
Figure 3:
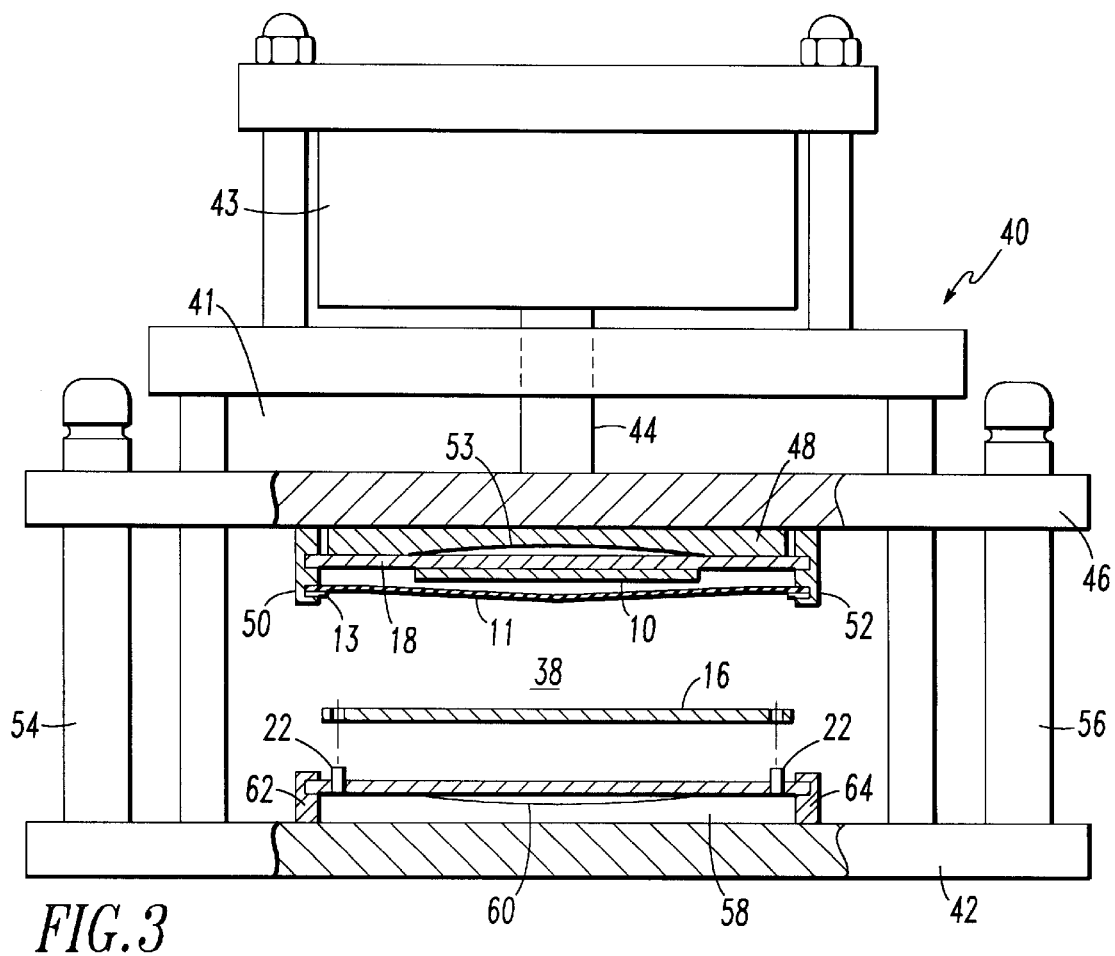
FIG. 3 is a central cross-sectional view of a press for holding and activating the embodiment shown in FIG. 1.

The inventive concept, as shown in FIG. 1, is based upon extrusion of elastic material, for example, a rubber pressure pad 10 having a thickness typically of between 1/16 in. and 1/8 in. thick through one or more openings 12 in a flat template 14 which define a cavity pattern to be formed in a sheet of unfired LTCC material and which is shown by reference numeral 16. The rubber pressure pad 10 is further shown fixed to the inner face of a flat top pressure plate 18, while a flat bottom pressure plate 20 is shown located beneath the template 14. A thin sheet 11 of latex rubber is also located adjacent the pressure pad 10 as shown in FIG. 3 for acting as a tape release member.

The bottom plate 20 includes a set of alignment pins 22 on its inner face 24 at the four corners thereof. The template 14 is shown also including a set of alignment holes 26 at the corners thereof which are adapted to come into registration with the alignment pins 22 of the bottom plate 20. Further as shown, the LTCC sheet 16, also includes a set of alignment holes 28.

The members shown in FIG. 1, when subjected to pressurization, for example 10–300 psi, applied to both the top and bottom plates 18 and 20, causes the rubber pressure pad 10 to be extruded into the holes 12 of the template 14, causing the sheet 16 to be sheared off at the edges of the template holes 12, effectively cutting the pattern of the template in the sheet 16. Following pressurization, the top plate 18 is raised, and the sheet 16 with the pattern cut therein is removed from the die and the tape remaining in the holes 12 of the template 14 is removed by vacuum. This process can be repeated as many times as desired with a fresh sheet of unfired LTCC or "green" tape 16 being inserted each time between the rubber pressure pad 10 and the template 14.

The most complicated part of the fabrication process involved in this invention is the formation of the template 14. Relatively inexpensive precision type polyimide templates can be formed by mechanical routing. Precise stainless steel templates can be obtained by electrode discharge machining or chemically etching, also at a relatively moderate cost. While polyimide and stainless steel templates are at present considered to be preferable, other potential template materials include "Mycarta" board, hard plastics, and etchable materials such as Be-Cu.

Figure 2A:
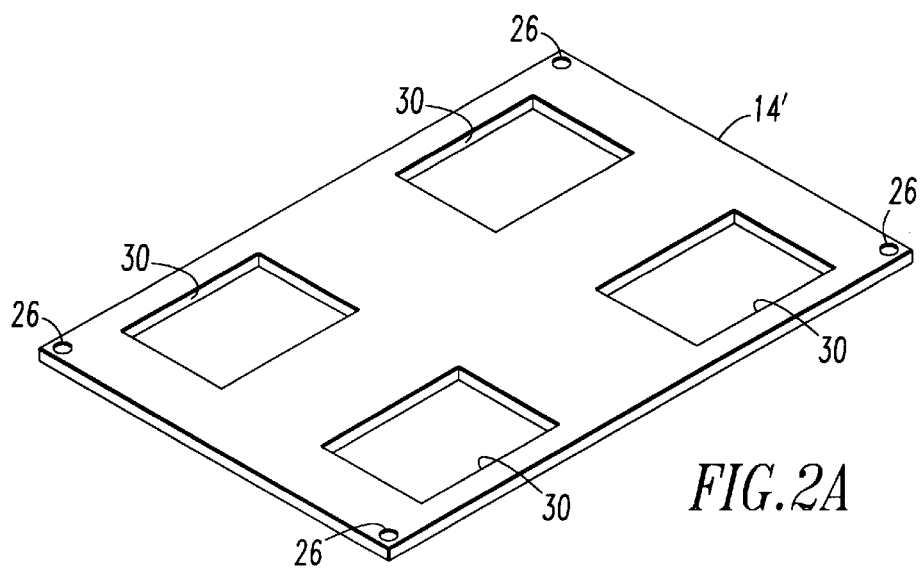
FIGS. 2A and 2B are perspective views disclosing other template designs which can be used with the apparatus shown in FIG. 1.
Figure 2B:
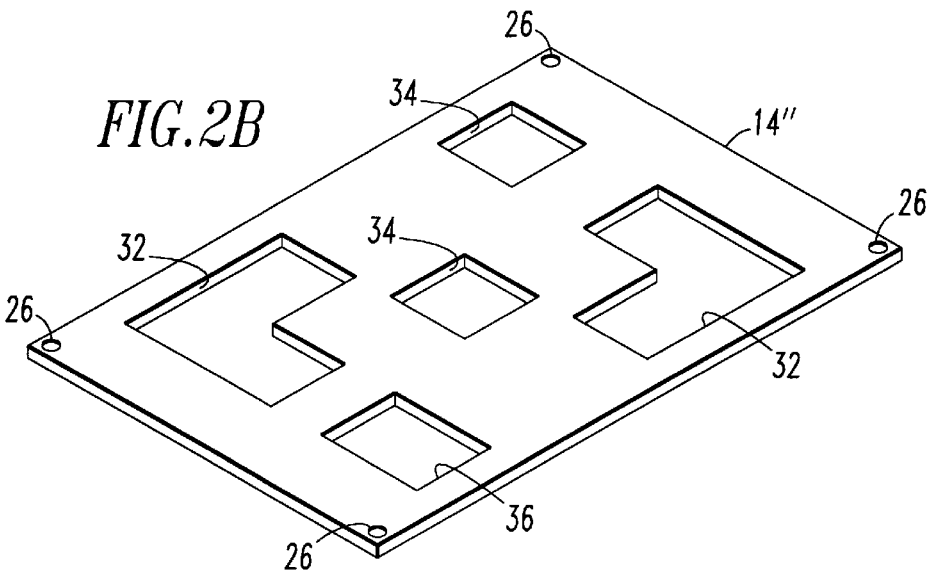

FIGS. 2A and 2B are intended to illustrate that templates 14 having different cavity patterns can be easily interchanged simply by substituting a new template for the one presently being used. FIG. 2A, for example, shows a template 14' including four substantially identical rectangular openings 30 formed therein, while FIG. 2B shows a template 14" including a pair of L-shaped apertures 32, a pair of square-shaped openings 34, and a single rectangular cut-out 36.

Referring now to FIG. 3, shown thereat is a uniaxial press assembly 38 in which the members shown in FIG. 1 are mounted. The press 38 includes a frame 40 mounted on a base 42. The frame 40 contains an air cylinder 43 to which is connected a piston rod 44 having a platen 46 attached to its outer extremity. On the underside of the platen 46 is attached a solid plate 48 and a pair of distending rails 50 and 52 containing slots for receiving the top pressure plate 18 and a metal frame member 13 containing the sheet of latex rubber 11 shown in FIG. 1. The solid metal plate 48 is also shown having a small concave indentation 53 for aiding in the removal of the pressure plate 18 from the plate 48.

The platen is moved up and down on four vertical posts secured to the base 42, two of which are shown by reference numerals 54 and 56, upon actuation of the piston 44 by the air cylinder 43.

Further as shown in FIG. 3, the template 14 is shown positioned on another solid plate 58 which is similar to the plate 48 in that it also includes a small concave indentation 60 for aiding the removal of the template 14 from a pair of slotted posts 62 and 64 which are secured to the base plate 42 along with the plate 58. Accordingly, when the sheet 16 of unfired LTCC material is positioned on the template 14 and the air cylinder 43 is activated, the top portion of the press 38 descends, causing the pressure pad to form the template holes in the sheet 16.

Thus what has been shown and described is a flexible ram forming die arrangement for the formation of cavity openings in laminate sheets of unfired LTCC material, with the attendant advantage of dramatically lowered capital investment and considerably higher throughput than that provided by the known prior art. This process can accommodate virtually any cavity design for LTCC substrates, with low turn-over time and cost and is adaptable for a number of other applications where relatively soft materials need to be cut to precise dimensions.

Having thus shown and described what is at present considered to be the preferred method and embodiment for carrying out the invention, it should be noted that the same has been made by way of illustration and not limitation. Accordingly, all modifications, alterations and changes coming within the spirit and scope of the invention as set forth in the appended claims are herein meant to be included.

We claim:

1. A method of forming one or more openings in a sheet of low temperature cofired ceramic (LTCC) material which corresponds to a cavity pattern produced when a plurality of said sheets are subsequently laminated together, comprising the step of:

placing a sheet of unfired LTCC material between an extrudable body of elastic material located on a first pressure plate and a template located on a second pressure plate and having one or more openings corresponding to said cavity pattern;

bringing the pressure plates together and applying a pressure at least on said first pressure plate and extruding said elastic material of said body through said one or more openings in said template, thereby shearing the LTCC material along the edges of said one or more openings and cutting the cavity pattern in the sheet of LTCC material;

removing the pressure from said first pressure plate and separating the pressure plates; and removing the sheet of LTCC material with the cavity pattern formed therein from between said body of elastic material and said template.

2. The method as defined by claim 1 and additionally including the step of removing residual LTCC material from said one or more openings in said template.

3. The method as defined by claim 2 wherein said step of removing comprises removing by vacuum.

4. The method of claim 1 wherein said pressure is between about 20 psi and about 100 psi.

5. The method of claim 1 and additionally including the step of fabricating a cavity pattern in said template.

6. The method of claim 5 wherein said step of fabricating comprises mechanically routing said cavity pattern in a polyimide template.

7. The method of claim 5 wherein said step of fabricating comprises machining said cavity pattern in a stainless steel template.

8. The method of claim 5 wherein said step of fabricating comprises chemically etching said cavity pattern in a stainless steel template.

* * * * *

UNITED STATES PATENT AND TRADEMARK OFFICE
CERTIFICATE OF CORRRECTION

PATENT NO. : 5,855,803
DATED : January 5, 1999
INVENTOR(S) : Alex Bailey, et al.

It is certified that error appears in the above-identified patent and that said Letters Patent is hereby corrected as shown below:

On the title page, item [56] insert the following:

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 5 | 2 | 4 | 2 | 6 | 4 | 1 09/07/93 | Horner et al. | | | |
| | | | | | | | | | | | | |

FOREIGN PATENT OR PUBLISHED FOREIGN PATENT APPLICATION

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | | 0 | 3 | 2 | 3 | 6 | 7 | 3 | 07/12/89 | EPO | | | |
| | | 2 | 5 | 3 | 6 | 0 | 2 | 9 | 02/24/77 | Germany | | | |
| | | | 9 | 2 | 1 | 0 | 9 | 8 | 04/25/47 | France | | | |

OTHER DOCUMENTS (Including Author, Title, Date, Pertinent Pages, etc.)

| Patent Abstract of Japan, "Method And Apparatus For Punching Green Sheet And Perforated Green Sheet", JP 02139202 A (NGK Spark Plug Co., Ltd.) 05/29/90 |
|---|

Signed and Sealed this

Twenty-sixth Day of October, 1999

Attest:

Q. TODD DICKINSON

*Attesting Officer*     Acting Commissioner of Patents and Trademarks